United States Patent
Tramoni et al.

(10) Patent No.: US 9,729,202 B2
(45) Date of Patent: *Aug. 8, 2017

(54) METHOD OF CONNECTING ONE OR MORE CONTACTLESS COMPONENTS TO A SINGLE ANTENNA, AND CORRESPONDING SYSTEM

(71) Applicant: STMICROELECTRONICS (ROUSSET) SAS, Rousset (FR)

(72) Inventors: Alexandre Tramoni, Le Beausset (FR); Pierre Rizzo, Trets (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/198,758

(22) Filed: Jun. 30, 2016

(65) Prior Publication Data

US 2016/0315664 A1 Oct. 27, 2016

Related U.S. Application Data

(63) Continuation of application No. 13/364,542, filed on Feb. 2, 2012, now Pat. No. 9,407,233.

(30) Foreign Application Priority Data

Feb. 4, 2011 (FR) ..................... 11 50931

(51) Int. Cl.
*H04B 5/00* (2006.01)
*H03H 7/40* (2006.01)
*H04W 76/02* (2009.01)

(52) U.S. Cl.
CPC ............ *H04B 5/0031* (2013.01); *H03H 7/40* (2013.01); *H04W 76/023* (2013.01)

(58) Field of Classification Search
CPC .... H04B 1/401; H04B 5/0012; H04B 5/0031; H04B 5/0081
See application file for complete search history.

(56) References Cited

U.S. PATENT DOCUMENTS

| | | | |
|---|---|---|---|
| 9,407,233 B2* | 8/2016 | Tramoni | H03H 7/40 |
| 2007/0063041 A1 | 3/2007 | Kamiyama et al. | |
| 2009/0101716 A1* | 4/2009 | Mani | G06K 7/0008 235/441 |

(Continued)

FOREIGN PATENT DOCUMENTS

EP 2107694 10/2009

*Primary Examiner* — Tuan Pham
(74) *Attorney, Agent, or Firm* — Slater Matsil, LLP

(57) ABSTRACT

A first component (CMP1) is connected to the antenna (ANT) and to an impedance matching circuit (CAI) configurable on command and connected to the antenna, and in the absence of another component (CMP2) connected to the antenna, the impedance matching circuit is placed in a first configuration in which it forms with the first component and the antenna a resonant circuit having a first resonant frequency compatible with a carrier frequency. In the presence of a second component (CMP2) connected to the antenna, the impedance matching circuit is placed in a second configuration in which it forms with the first component, the second component and the antenna a resonant circuit having a second resonant frequency compatible with the carrier frequency.

23 Claims, 5 Drawing Sheets

(56) References Cited

U.S. PATENT DOCUMENTS

2009/0247079 A1* 10/2009 Charles ............... G06K 7/0008
455/41.1
2011/0050177 A1* 3/2011 Nerheim .................. F41C 3/00
320/136

* cited by examiner

METHOD OF CONNECTING ONE OR MORE CONTACTLESS COMPONENTS TO A SINGLE ANTENNA, AND CORRESPONDING SYSTEM

FIELD OF THE INVENTION

The invention relates to the electronic components connected to an antenna, and relates more particularly to the connection to a single antenna of one or more components, in particular components configured to exchange information with an external device via the antenna according to a contactless type communication protocol. Generally, such components are more simply referred to as "contactless components" and may for example be so-called "NFC" components, i.e. components compatible with NFC ("Near Field Communication") technology.

BACKGROUND OF THE INVENTION

In addition to its conventional telephonic function, a cellular mobile telephone may be used to exchange information with a contactless external device by using a contactless communication protocol, for example the type A protocol defined in the ISO/IEC 14 443 standard.

This makes it possible to exchange information between the contactless external device, for example a reader, and a contactless component provided in the telephone. Numerous applications are thus possible, such as a toll barrier crossing in transport facilities (the mobile telephone acts as transport ticket) or else payment applications (the mobile telephone acts as a credit card).

Near Field Communication (NFC) is a short-distance high-frequency wireless communication technology, which allows exchanges of data between two contactless devices over a short distance, for example 10 cm. NFC technology is standardized in the documents ISO/IEC 18 092 and ISO/IEC 21 481 but incorporates a variety of pre-existing standards including the type A and type B protocols of the ISO/IEC 14 443 standard.

In view of the growth in the market for contactless applications, it is becoming particularly beneficial, when a wireless communication apparatus is used, for example a cellular mobile telephone, already equipped with a contactless component capable of communicating with an external contactless device, for example a reader, via an antenna, to be able to connect another contactless component to this same antenna. This would make it possible in particular to be able to clearly separate the applications stemming from various sources (banks, transport operators, telephone operators, etc.).

SUMMARY OF THE INVENTION

According to one embodiment, there is provided a method and a system making it possible, by selection, to optionally connect a second contactless component to the antenna already connected to a first contactless component, for example incorporated in a cellular mobile telephone, to allow selective individual operation of each component, and in particular of the first component in the presence or otherwise of the second connected component, with the least possible disturbance.

According to one aspect, there is provided a method of connection to a single antenna of one or more components that are configured to exchange information with an external device via the antenna according to a communication protocol of the contactless type using a carrier frequency, for example the frequency 13.56 MHz of the type A or B protocol defined in the ISO/IEC 14 443 standard. The method includes connection of a first component to the antenna and to an impedance matching circuit configurable on command and connected to the antenna, and in the absence of another component connected to the antenna, placement of the impedance matching circuit in a first configuration in which it forms with the first component and the antenna a resonant circuit having a first resonant frequency compatible with the carrier frequency, and in the presence of a second component connected to the antenna, placement of the impedance matching circuit in a second configuration in which it forms with the first component, the second component and the antenna a resonant circuit having a second resonant frequency (which may be equal or different from the first resonant frequency) compatible with the carrier frequency.

Thus, according to this aspect, action is taken directly at the level of the impedance matching circuit so as to configure it differently depending on whether a single component is connected to the antenna, or whether the second component is also connected to the antenna. And, therefore, the impedance matching circuit in its first configuration makes it possible to form with the antenna a resonant circuit resonating at an appropriate resonant frequency, for example 13.56 Mhz or around 13.56 MHz for the ISO/IEC 14 443 standard, thereby allowing the first component to communicate with the external contactless device by using the carrier frequency. When the second component is connected, the placement of the impedance matching circuit in its second configuration makes it possible, with the help of an appropriate value for the capacitive value exhibited by the second component, to be able also to form with the antenna and the first and second components, a resonant circuit resonating at an appropriate resonant frequency, for example 13.56 Mhz or else a very close frequency.

Thus, even with the first component connected, the second component can communicate with an external contactless device by using the carrier frequency, and even with the second component connected, the first component can communicate with an external contactless device by using the carrier frequency. Of course, to avoid conflicts, it is particularly advantageous to make provision for example for protocol adaptation by software, prohibiting the two components from being able to communicate simultaneously when they are both connected.

A resonant frequency compatible with the carrier frequency is a frequency allowing communication of the component with an external device by using the carrier of the contactless communication protocol having the carrier frequency. Ideally the capacitive impedances of the impedance matching circuit, those of the components and the inductive impedance of the antenna are chosen so as to obtain resonant frequencies that are equal or very close to the carrier frequency. In this case where the resonant frequencies are equal to the carrier frequency, operation is optimized with for example a maximum operating distance. That said, the person skilled in the art knows that a resonant frequency differing from the carrier frequency nonetheless allows operation according to the contactless communication protocol with, however, performance that is degraded, for example in terms of distance or throughput. The compatible resonant frequencies can therefore be chosen in frequency ranges containing the carrier frequency. The person skilled in the art will know how to adjust the size of these frequency ranges having regard to the application or applications envisaged and/or the performance desired, for example in terms of range and/or throughput of transmitted data.

Thus, by way of example in the case of a type A transmission protocol defined in the ISO/IEC 14443 standard using a modulation of a carrier having a carrier frequency equal to 13.56 MHz, resonant frequencies contained in a range of plus or minus 15% around the carrier frequency, may be considered to be compatible frequencies.

According to another aspect, there is provided an electronic system comprising an antenna, a first component configured to communicate via the antenna according to a communication protocol of the contactless type using a carrier frequency, an impedance matching circuit configurable on command and connected to the first component as well as to the antenna, an interface connected to the terminals of the antenna and to the impedance matching circuit and configured to cooperate in a removable manner with a second component configured to communicate according to a communication protocol of the contactless type using the carrier frequency. The impedance matching circuit has a first configuration in which it forms with the first component and the antenna a resonant circuit having a first resonant frequency compatible with the carrier frequency and a second configuration in which it forms with the first component, the second component and the antenna a resonant circuit having a second resonant frequency compatible with the said carrier frequency. A controller or control means is configured to place the impedance matching circuit in its first configuration in the absence of any second component cooperating with the interface and in its second configuration in the presence of a second component cooperating with the interface.

According to one embodiment, the impedance matching circuit includes a first capacitor connected in parallel with the antenna as well as a capacitive path connected in parallel with the antenna and activatable/deactivatable by the controller, the capacitive path being in its activated state in the first configuration of the impedance matching circuit and in its deactivated state in the second configuration of the impedance matching circuit.

According to one embodiment the capacitive path comprises a second capacitor possessing a first electrode connected to a first terminal of the antenna, a third capacitor possessing a first electrode connected to a second terminal of the antenna and controllable activation/deactivation component or means connected in series between a second electrode of the second capacitor and a second electrode of the third capacitor. The controllable activation/deactivation component or means includes a first state corresponding to the activated state of the capacitive path, in which they permit a mutual effective connection of the second electrodes of the second and third capacitors, and a second state corresponding to the deactivated state of the capacitive path, in which they disable a mutual effective connection of the second electrodes of the second and third capacitors.

Acting at the level of the impedance matching circuit aft of the second and third capacitors allows the use of typical switching devices, for example transistors. Indeed, the voltage values during these switchings are low with respect to those which would have occurred in the case where direct switching at the level of the first capacitor had been envisaged, since it is at the terminals of this first capacitor that the circuit resonates.

According to one embodiment, the controllable activation/deactivation component or means comprise at least one PMOS transistor connected in series between the second and third capacitors and controllable on its gate.

According to another aspect, there is proposed a wireless communication apparatus, for example a cellular mobile telephone, comprising an electronic system such as defined hereinabove.

BRIEF DESCRIPTION OF THE DRAWINGS

Other advantages and characteristics of the invention will be apparent on examining the detailed description of wholly non-limiting modes of implementation and embodiments, and the appended drawings in which.

DETAILED DESCRIPTION OF THE PREFERRED EMBODIMENTS

Figure 1:
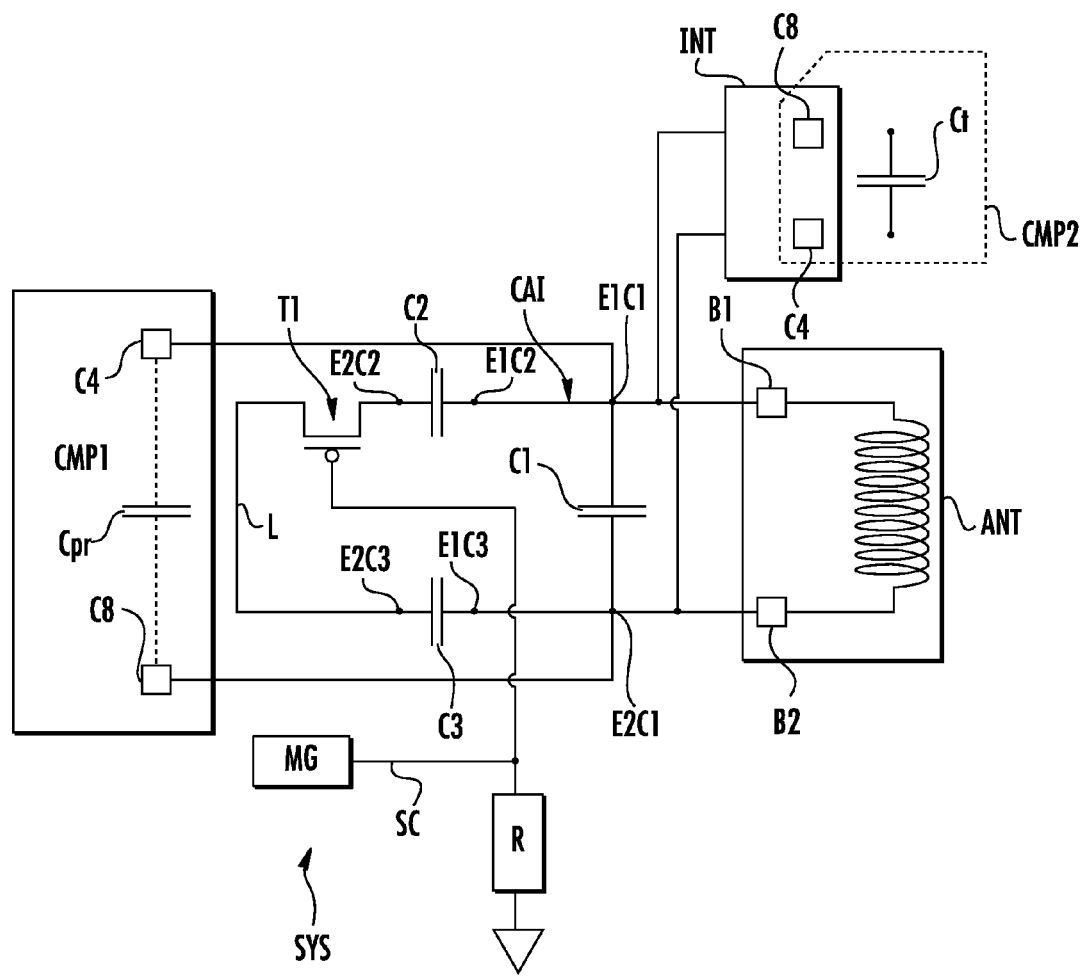
FIG. 1 is a schematic diagram illustrating an embodiment of a system according to the invention.

In FIG. 1, the reference SYS designates an electronic system comprising a first component CMP1. This component CMP1 may for example be a secure element, or UICC. A UICC such as defined in the document ETSI TR 102 216 V3.0.0 (09 2003) designates a chip card in accordance with the specifications written and maintained by the ETSI SCP (Smart Card Platform) technical committee. The system SYS also comprises an antenna ANT, for example an inductive antenna exhibiting an inductance La, the two terminals B1 and B2 of which are connected to the component CMP1, typically to the contacts C4 and C8 of this component when dealing with a UICC. The component CMP1 exhibits at its terminals a capacitance, for example a stray capacitance, Cpr.

The system SYS also comprises an impedance matching circuit CAI also connected to the terminals B1 and B2 of the antenna, and to which the component CMP1 is also connected. This impedance matching circuit comprises here a first capacitor C1 connected in parallel to the terminals of the antenna ANT. More precisely, the capacitor C1 has a first electrode E1C1 connected to the terminal B1 and a second electrode E2C1 connected to the terminal B2 of the antenna ANT.

The impedance matching circuit CAI also comprises a capacitive path formed here of a second capacitor C2 and of a third capacitor C3. The second capacitor C2 possesses a first electrode E1C2 connected to the first electrode E1C1 of the first capacitor C1. Likewise, the third capacitor C3 possesses a first electrode E1C3 connected to the first electrode E2C1 of the first capacitor C1. The second electrode E2C2 of the second capacitor C2 and the second electrode E2C3 of the third capacitor C3 are mutually connected by way of a PMOS transistor T1 forming a controllable component or means of activation/deactivation of the capacitive path formed by the capacitors C2 and C3.

In this regard, the system SYS furthermore comprises a controller or control means MG configured to deliver a control signal SC on the gate of the transistor T1. A resistor R is also connected between the gate of the transistor T1 and ground.

As will be seen in greater detail hereinafter, the transistor T1 possesses a first state in which it is on and consequently makes it possible to effect a short-circuit L between the second and third capacitors C2 and C3. The transistor T1 also possesses a second state in which it is off, consequently disabling a mutual effective connection of the second and third capacitors C2 and C3.

When the control signal SC delivered by the controller MG is a high-impedance signal, the resistor R linked to ground pulls the gate voltage of the transistor T1 to earth (0 volts), thereby making it possible to turn on this transistor T1. On the other hand, when the controller MG delivers a control signal SC having a high logic state, for example 3 volts, the transistor T1 is turned off.

In addition to the elements which have just been described, the system SYS also comprises an interface INT connected in parallel to the two terminals B1 and B2 of the antenna ANT and capable of receiving in a removable manner a second component CMP2. This component CMP2 may for example be another secure element, or UICC. In this case the contacts C4 and C8 of the component CMP2 (UICC) are connected via the interface INT to the terminals B2 and B1 of the antenna.

The second component CMP2 could also be for example a radiofrequency USB key adapted to operation according to a contactless communication protocol, the interface INT then being a USB port, or else an SD (Secure Digital) or pSD card adapted to operation according to a contactless protocol and readily connectable to a cellular telephone. Between these two contacts the component CMP2 exhibits, coupled to the antenna ANT via the interface INT, a capacitance having a value Ct.

To obtain optimized operation, a contactless component forms with the antenna and the impedance matching circuit a resonant circuit having a resonant frequency f equal to the example carrier frequency 13.56 Mhz.

Figure 2:
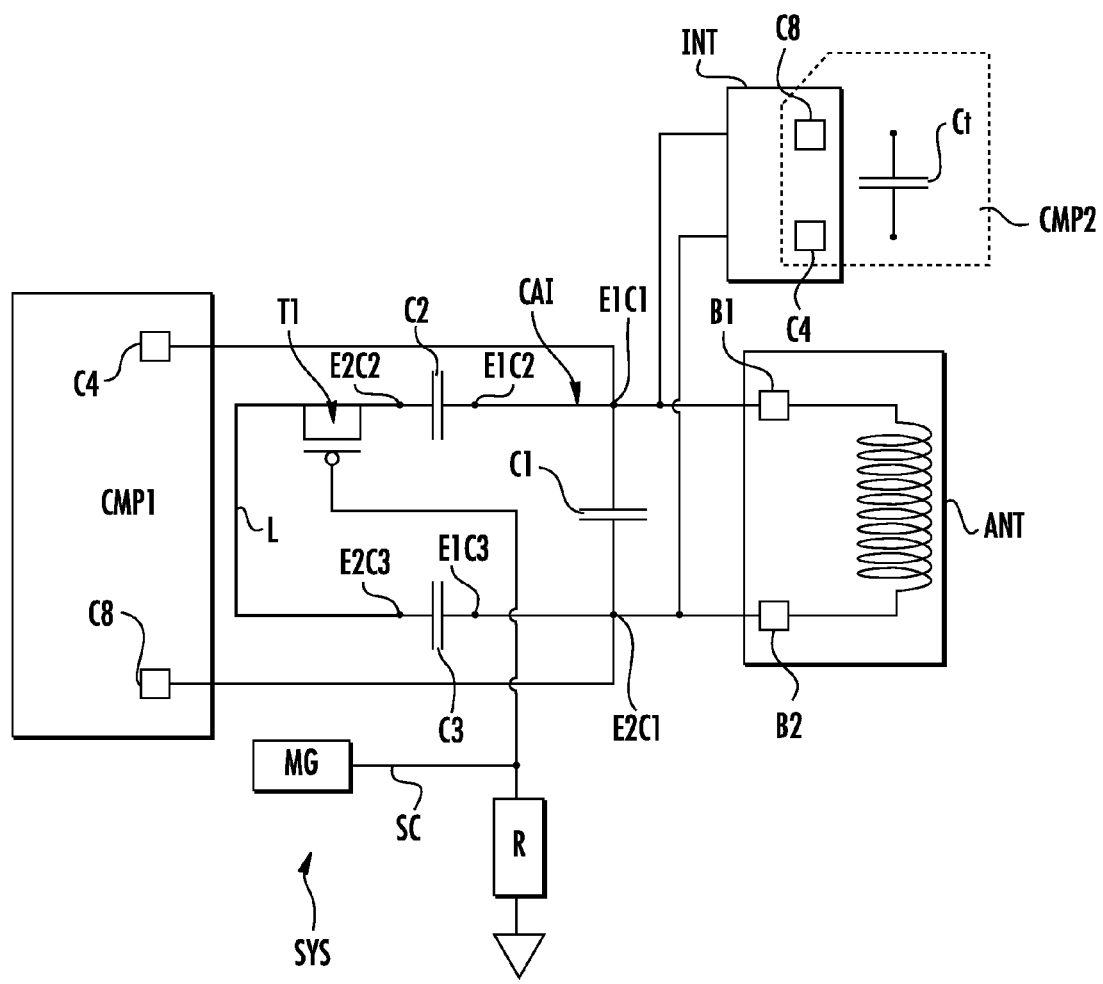
FIGS. 2 and 3 are schematic diagrams illustrating modes of implementation of the method according to the invention.

Hence, when, as illustrated in FIG. 2, no second component CMP2 is connected to the antenna ANT by way of the interface INT, the transistor T1 is in its on state short-circuiting the two capacitors C2 and C3 and, if Cs designates the capacitive value of each of the capacitors C2 and C3 and Cp designates the capacitive value of the first capacitor C1, these capacitive values are chosen so as to satisfy formula (1) hereinbelow:

$$f1 = 13.56 \text{ Mhz} = \frac{1}{2\pi \sqrt{La\left(\frac{Cs}{2} + Cpr + Cp\right)}} \quad (1)$$

in which La designates the inductive value of the antenna ANT and f1 the resonant frequency of the resonant circuit.

If the component CMP2 were connected to the system SYS configured as illustrated in FIG. 2, then, the circuit as a whole would resonate at a frequency ft very different from 13.56 Mhz. Indeed, the resonant frequency ft would be defined by formula (2) hereinbelow:

$$ft = \frac{1}{2\pi \sqrt{La\left(\frac{Cs}{2} + (Cp + Cpr + Ct)\right)}} \quad (2)$$

And, it is seen that since the capacitances Cs and Cp have been calculated so as to make it possible to obtain a resonant frequency of 13.56 Mhz, the resonant frequency ft would then be quite different from the frequency 13.56 Mhz, whatever the value of the capacitance Ct. This would therefore result in a significant risk of poor operation not only of the component CMP1 but also of the component CMP2.

The fact that the capacitive path formed of the capacitors C2 and C3 can be activated or deactivated, makes it possible to address this problem.

Indeed, as illustrated in FIG. 2, when no component CMP2 is housed in the interface INT, the impedance matching circuit is actually formed of the capacitors C1, C2 and C3 (the transistor T1 is on), thereby making it possible to obtain a resonant frequency f1 defined by formula (1), and equal to 13.56 Mhz for example, so permitting optimized operation in respect of the component CMP1.

Figure 3:
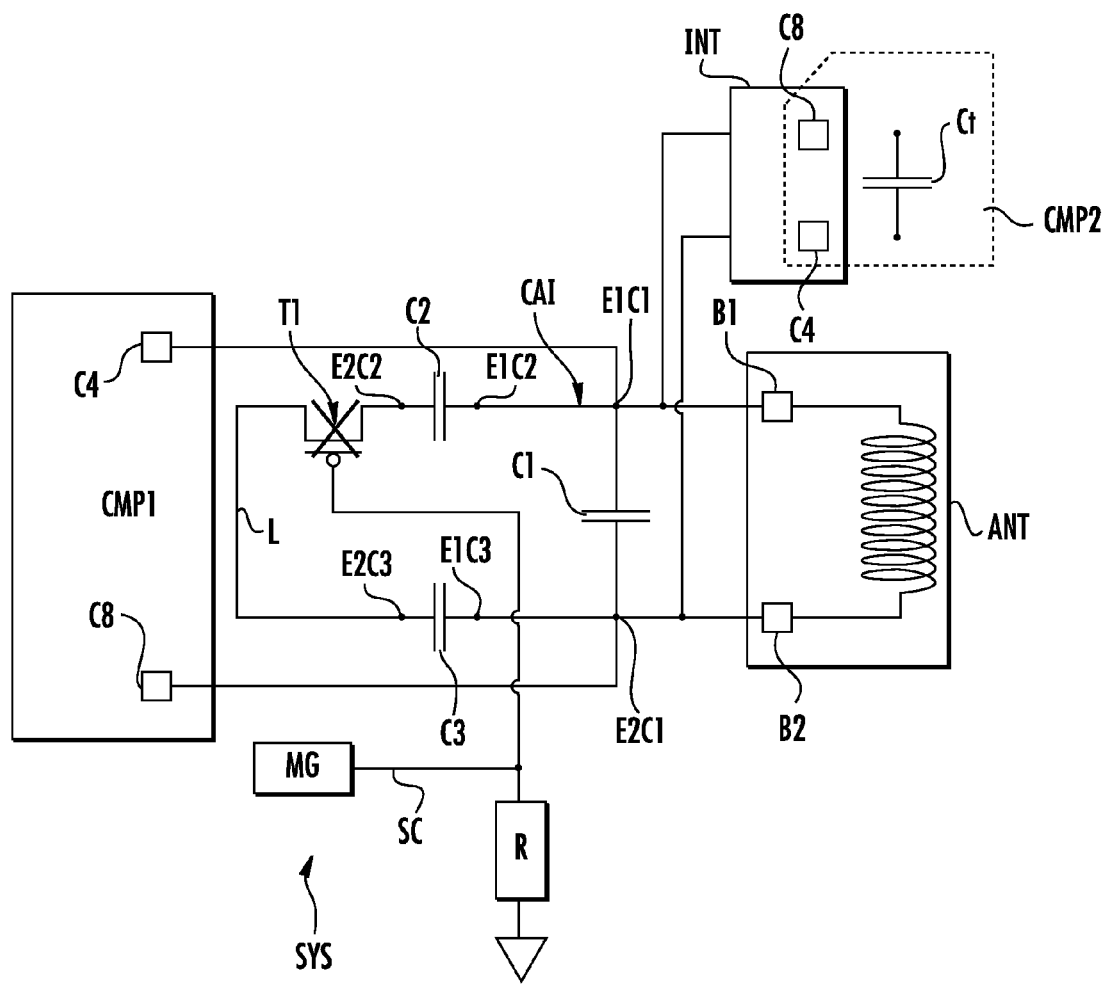

On the other hand, when the component CMP2 is housed in the interface INT (FIG. 3), the controller MG turns the transistor T1 off, and the new resonant frequency f2 of the circuit formed by the first component CMP1, the second component CMP2, the impedance matching circuit in its second configuration and the antenna, is then defined by formula (3) hereinbelow:

$$f2 = \frac{1}{2\pi \sqrt{La(Ct + Cpr + Cp)}} \quad (3)$$

Using an appropriate choice for the capacitive value Ct (taken equal for example to Cs/2) of the component CMP2, it then becomes possible to adjust this resonant frequency f2 to the value of 13.56 Mhz, thereby making it possible to be able to choose the component which will communicate with an external device while offering optimized operation in respect of the selected component. And the fact of having disabled the capacitors C2 and C3 in this configuration and therefore disabled a capacitive value, gives much more flexibility in being able to add another capacitance (capacitance Ct) and attain an acceptable or indeed optimal resonant frequency f2.

Thus, by making the impedance matching circuit differ as a function of the optional connection of the second component CMP2 to the antenna, it is possible to guarantee correct operation of each of the components CMP1 and CMP2 whatever configuration is adopted. It therefore becomes possible to use two contactless components with the same antenna ANT while offering the possibility of obtaining optimized operation in respect of the component CMP1 whether or not the component CMP2 is connected, and in respect of the component CMP2 when it is connected.

Moreover, the switching current (or the switching voltage) implemented at the level of the transistor T1 is of low value, since the switching is performed between the electrodes E2C2 and E2C3 of the two capacitors C2 and C3, and non at the terminals of the first capacitor C1, thereby making it possible to use conventional PMOS transistors rather than high-voltage components.

Figure 4:
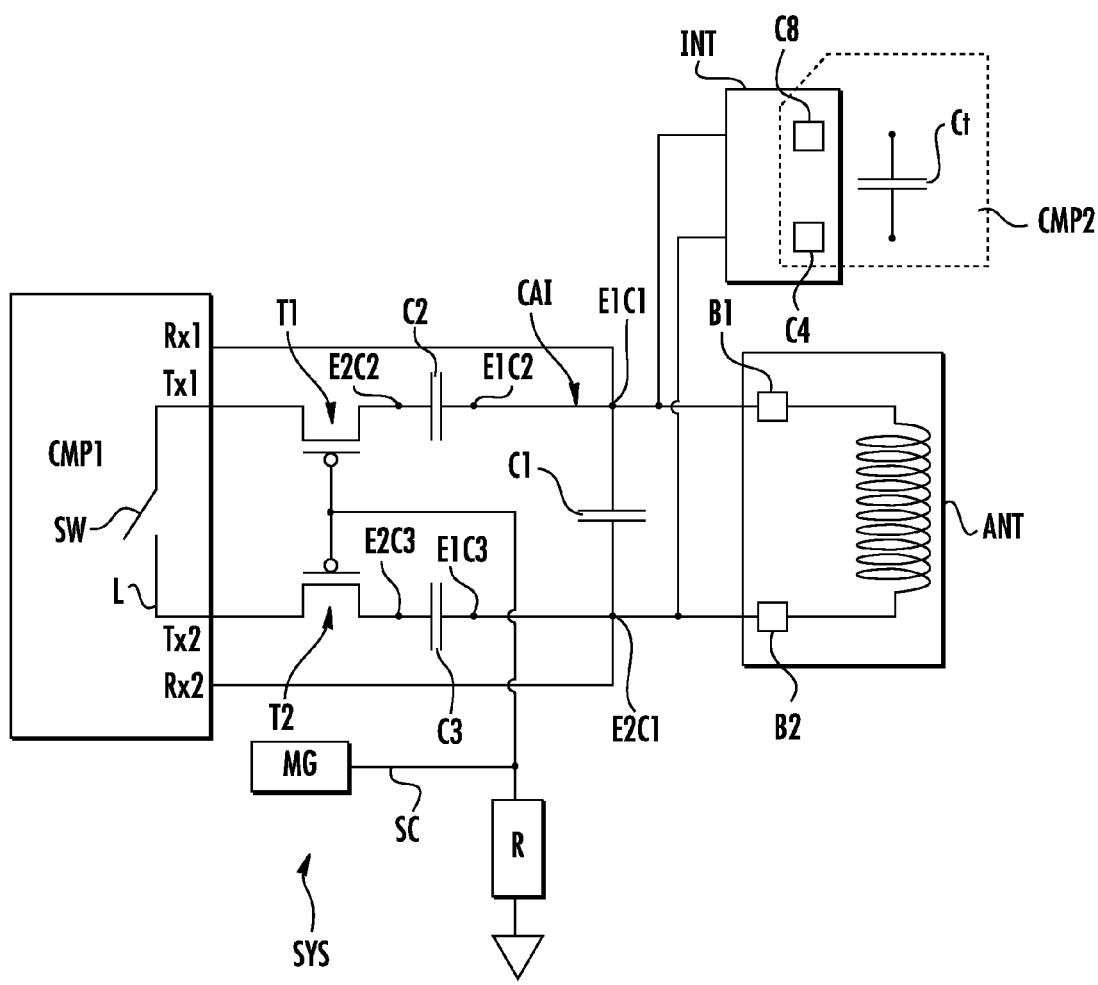
FIG. 4 is a schematic diagram illustrating another embodiment of a system according to the invention.

As a variant, as illustrated in FIG. 4, the component CMP1 may be an NFC component such as an NFC microcontroller, for example the component marketed by the company STMicroelectronics under the reference ST21NFC A. This component exhibits the particular feature of being able to be used in "card" mode or else in "reader" mode. In this regard, an internal switch SW makes it possible to short-circuit the terminals TX1 and TX2 so as to permit operation in card mode, or to not short-circuit these terminals TX1 and TX2 so as to permit operation in reader mode. The component also comprises two other terminals RX1 and RX2 connected to the terminals of the first capacitor C1.

For the implementation of the present invention, the component CMP1 is used in card mode. In this case, the activation/deactivation means comprise two PMOS transistors T1 and T2, controlled on their respective gate by the signal SC, and respectively connected between the capacitors C2, C3 and the terminals TX1, TX2. What has just been described in respect of the transistor T1 of FIGS. 1 to 3, applies here to both transistors T1 and T2.

The link L between the two transistors T1 and T2, which makes it possible to ensure the short-circuit between the capacitors C2 and C3 when the transistors T1 and T2 are on, is therefore effected here inside the component CMP1.

Figure 5:
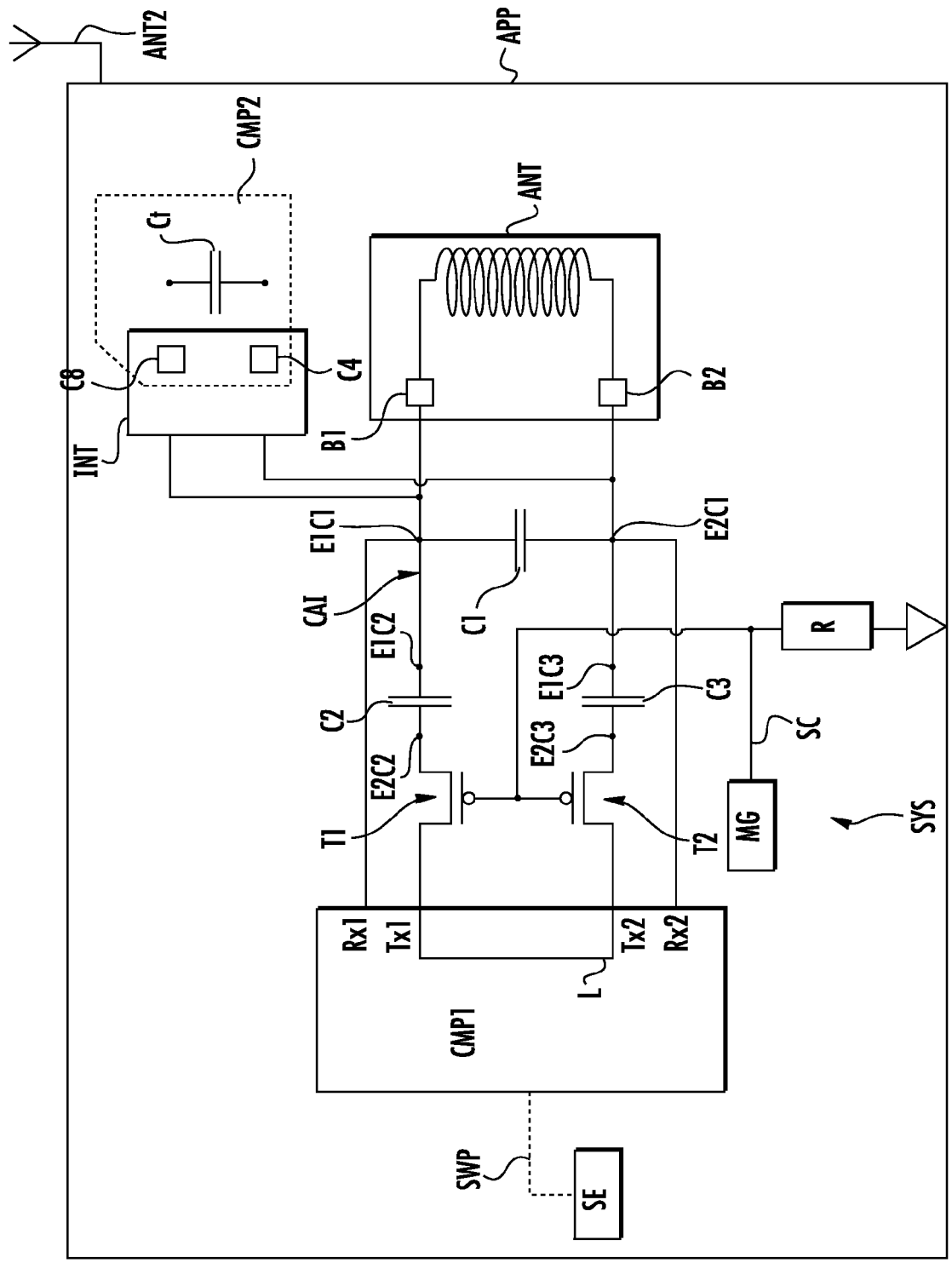
FIG. 5 is a schematic diagram illustrating an embodiment of a wireless communication apparatus according to the invention.

As illustrated in FIG. 5, the system SYS may be housed in a wireless communication apparatus APP, for example a cellular mobile telephone capable of ensuring its telephone function with a base station for example, via an antenna ANT2. The telephone can also allow an exchange of data via a contactless communication protocol with an external device, for example a reader, via the antenna ANT by using the component CMP1 or CMP2.

When the component CMP1 is an NFC micro-controller, for example the ST21NFCA component, the telephone APP can also contain a secure element SE (UICC) connected to the component CMP1 by an SWP link bus, that is to say a bus supporting the SWP protocol defined in the ETSI TS 102 613 standard.

That which is claimed:

1. An electronic device comprising:
   an antenna having first and second terminals;
   a first irremovable component coupled to the antenna and configured to communicate via the antenna according to a first contactless-type communication protocol;
   a second removable component configured to couple to the antenna and communicate according to a second contactless-type communication protocol;
   an impedance matching circuit comprising a first capacitor having a first electrode coupled to the first terminal of the antenna and a second electrode coupled to the second terminal of the antenna, a second capacitor having a first electrode coupled to the first electrode of the first capacitor and a second electrode, and a third capacitor having a first electrode coupled to the second electrode of the first capacitor and a second electrode; and
   a controllable activation component coupled between the second electrode of the second capacitor and the second electrode of the third capacitor and configured to define a first configuration state of the impedance matching circuit formed by the first, second and third capacitors when the second removable component is not coupled to the antenna, and a second configuration state of the impedance matching circuit when the second removable component is coupled to the antenna and the second and third capacitors are disabled from the impedance matching circuit.

2. The electronic device according to claim 1, wherein the first configuration state defines a resonant circuit between the first irremovable component and the antenna having a resonant frequency compatible with a carrier frequency.

3. The electronic device according to claim 1, wherein the second configuration state defines a resonant circuit between the second removable component and the antenna having a resonant frequency compatible with a carrier frequency.

4. The electronic device according to claim 1, further comprising an interface configured to couple the second removable component to the antenna.

5. The electronic device according to claim 1, further comprising a controller coupled to the controllable activation component to select one of the first and second configuration states.

6. The electronic device according to claim 1, wherein the controllable activation component comprises at least one MOS transistor.

7. The electronic device according to claim 1, wherein the controllable activation component comprises a pair of MOS transistors.

8. The electronic device according to claim 1, wherein the first irremovable component comprises a Near Field Communication (NFC) compatible component.

9. The electronic device according to claim 8, wherein the antenna comprises an NFC antenna.

10. An electronic device comprising:
    an antenna;
    a first irremovable component coupled to the antenna and configured to communicate via the antenna according to a first contactless-type communication protocol;
    a second removable component configured to couple to the antenna and communicate according to a second contactless-type communication protocol;
    an impedance matching circuit comprising first, second and third capacitors; and
    a controllable activation component configured to define a first configuration state of the impedance matching circuit formed by the first, second and third capacitors when the second removable component is not coupled to the antenna, and a second configuration state of the impedance matching circuit when the second removable component is coupled to the antenna and the second and third capacitors are disabled from the impedance matching circuit.

11. The electronic device according to claim 10, wherein the first configuration state defines a resonant circuit between the first irremovable component and the antenna having a resonant frequency compatible with a carrier frequency.

12. The electronic device according to claim 10, wherein the second configuration state defines a resonant circuit between the second removable component and the antenna having a resonant frequency compatible with a carrier frequency.

13. The electronic device according to claim 10, further comprising an interface configured to couple the second removable component to the antenna.

14. The electronic device according to claim 10, further comprising a controller coupled to the controllable activation component to select one of the first and second configuration states.

15. The electronic device according to claim 10, wherein the controllable activation component comprises at least one MOS transistor.

16. The electronic device according to claim 10, wherein the controllable activation component comprises a pair of MOS transistors.

17. The electronic device according to claim 10, wherein the first irremovable component comprises a Near Field Communication (NFC) compatible component.

18. The electronic device according to claim 17, wherein the antenna comprises an NFC antenna.

19. A method of configuring an impedance matching circuit coupled to an antenna for contactless-type communication, the impedance matching circuit comprising first, second and third capacitors, the method comprising:

coupling a first irremovable component to the antenna and to the impedance matching circuit;
selectively coupling a second removable component to the antenna and the impedance matching network; and
operating a controllable activation component to define a first configuration state of the impedance matching circuit formed by the first, second and third capacitors when the second removable component is not coupled to the antenna, and to define a second configuration state of the impedance matching circuit when the second removable component is coupled to the antenna and the second and third capacitors are disabled from the impedance matching circuit.

20. The method according to claim 19, wherein the first configuration state defines a resonant circuit between the first irremovable component and the antenna having a resonant frequency compatible with a carrier frequency.

21. The method according to claim 19, wherein the second configuration state defines a resonant circuit between the second removable component and the antenna having a resonant frequency compatible with a carrier frequency.

22. The method according to claim 19, wherein the first irremovable component comprises a Near Field Communication (NFC) compatible component.

23. The method according to claim 22, wherein the antenna comprises an NFC antenna.

* * * * *